(12) United States Patent
Kim et al.

(10) Patent No.: US 11,917,800 B1
(45) Date of Patent: Feb. 27, 2024

(54) MULTI-LAYERED WINDOW OR DOOR SYSTEM FOR ELECTROMAGNETIC PULSE PROTECTION

(71) Applicant: ELECTRONICS AND TELECOMMUNICATIONS RESEARCH INSTITUTE, Daejeon (KR)

(72) Inventors: Dae-Yeon Kim, Daejeon (KR); Dae-Heon Lee, Daejeon (KR); Seung-Kab Ryu, Daejeon (KR)

(73) Assignee: ELECTRONICS AND TELECOMMUNICATIONS RESEARCH INSTITUTE, Daejeon (KR)

(*) Notice: Subject to any disclaimer, the term of this patent is extended or adjusted under 35 U.S.C. 154(b) by 0 days.

(21) Appl. No.: 18/201,364

(22) Filed: May 24, 2023

(30) Foreign Application Priority Data

Feb. 27, 2023 (KR) ......................... 10-2023-0025952

(51) Int. Cl.
*H05K 9/00* (2006.01)
*E06B 5/18* (2006.01)
*E06B 1/32* (2006.01)

(52) U.S. Cl.
CPC ............ *H05K 9/0005* (2013.01); *E06B 1/32* (2013.01); *E06B 5/18* (2013.01)

(58) Field of Classification Search
CPC ........................... H05K 9/0088; H05K 9/0005
See application file for complete search history.

(56) References Cited

U.S. PATENT DOCUMENTS

| 8,987,610 | B2 | 3/2015 | Kim et al. | |
|---|---|---|---|---|
| 9,144,185 | B1* | 9/2015 | Hansen | ................ H05K 9/0088 |
| 2007/0252771 | A1* | 11/2007 | Maezawa | ......... G06K 19/07771 |
| | | | | 361/818 |
| 2020/0095480 | A1* | 3/2020 | Campbell | ............ C09J 133/064 |

FOREIGN PATENT DOCUMENTS

| JP | 2002-089157 A | 3/2002 |
|---|---|---|
| KR | 10-2009-0111126 A | 10/2009 |
| KR | 10-0990828 B1 | 10/2010 |
| KR | 10-0995421 B1 | 11/2010 |
| KR | 10-1319488 B1 | 10/2013 |
| KR | 10-2015-0007389 A | 1/2015 |
| KR | 10-1547869 B1 | 8/2015 |
| KR | 10-2016-0014085 A | 2/2016 |
| KR | 10-1617669 B1 | 5/2016 |
| KR | 10-1826241 B1 | 2/2018 |
| KR | 10-2008955 B1 | 8/2019 |
| KR | 10-2284845 B1 | 8/2021 |

* cited by examiner

*Primary Examiner* — Hung V Ngo
(74) *Attorney, Agent, or Firm* — LRK PATENT LAW FIRM

(57) ABSTRACT

Disclosed herein is a multi-layered window or door system for EMP protection. This may include a frame-shaped window or door frame, a plurality of shielding materials disposed on a side of the window or door frame to be spaced apart from each other, a first bracket disposed between the plurality of shielding materials and supported by an elastic mechanism, and a second bracket disposed outside an outermost shielding material among the plurality of shielding materials and supported by a cylinder.

15 Claims, 5 Drawing Sheets

MULTI-LAYERED WINDOW OR DOOR SYSTEM FOR ELECTROMAGNETIC PULSE PROTECTION

CROSS REFERENCE TO RELATED APPLICATION

This application claims the benefit of Korean Patent Application No. 10-2023-0025952, filed Feb. 27, 2023, which is hereby incorporated by reference in its entirety into this application.

BACKGROUND OF THE INVENTION

1. Technical Field

The present disclosure relates to an electromagnetic pulse (EMP) protection technology for preventing the destruction of important electronic equipment against nuclear/non-nuclear EMP attacks.

2. Description of Related Art

A shielding door of an electromagnetic pulse (EMP) shielding facility is made of metal having high conductivity, such as iron or copper, to realize a shielding structure. Depending on a product structure, the door is classified into a swing door and a sliding door. In order to secure high shielding performance (80 dB or more, 10 kHz to 1 GHz), a knife-finger strip structure is applied, so that it is heavy and has high manufacturing cost. In addition, there is a problem that it is difficult to apply to the band of 10 kHz to 18 GHz requiring EMP protection.

In Korea, EMP shielding facilities meeting military standards are localized by domestic companies, and are then constructed for the military and public institutions. In recent, a shielding rack is also being actively commercialized. Further, this is cost prohibitive for application in a civil facility due to high construction and installation costs. Since EMP threat exists, countermeasures are being established to protect against the threat. Thus, it is expected that there will be a continuous demand for financial institutions, information and communication infrastructure, and civil facilities (information and communication, medical facilities, etc.).

In other countries, the main shielding performance of released products is approximately 20 dB at 10 kHz and 100 dB at 1 GHz. A focus is on the development of an ultra-wideband (100 dB from 10 kHz to 18 GHz) EMP protection shielding rack to protect a non-nuclear EMP, but research and development are limited due to the difficulty of miniaturization depending on the selection of a shielding material of a component capable of shielding electromagnetic waves and a manufacturing method.

That is, among components of the EMP protection facility, it is important to design and manufacture a shielding door that is frequently opened and closed in operation. Indeed, in the case of the shielding rack, the manufacture cost of the door accounts for about 50% of a total rack manufacturing cost, thus leading to a high manufacturing cost. Further, since a conductive metal material having a certain thickness or more should shield electromagnetic waves, the weight of a product may be very heavy. Furthermore, long debugging time and cost are required until performance is tested after production/assembly.

In order to overcome the limitations of the conventional shielding door, it is necessary to manufacture a shielding door that may satisfy all of shielding performance, convenience, durability, and economic efficiency. There is a need for developing a shielding window or door system that may block external electromagnetic waves while allowing inside/outside air to pass through the shielding door as well as a shielding structure.

According to the related art, i.e. Korean Patent No. 10-2284845 entitled "Blind type window or door system for EMP protection", the shielding material is formed of cloth or film, and an existing finger and knife-edge coupling structure is replaced with a blind structure to improve weight and convenience.

Conventionally, since this is formed of one blind type window or door system, it is difficult to further improve the shielding performance.

PRIOR ART DOCUMENTS

Patent Documents (Patent Document 1) KR 10-2284845 (Jul. 9, 2021)

SUMMARY OF THE INVENTION

Accordingly, the present disclosure has been made keeping in mind the above problems occurring in the prior art, and an object of the present disclosure is to provide a multi-layered window or door system for EMP protection to improve the convenience of opening or closing the window or door system while improving shielding performance.

In accordance with an aspect of the present disclosure to accomplish the above object, there is provided a multi-layered window or door system for EMP protection, including a frame-shaped window or door frame, a plurality of shielding materials disposed on a side of the window or door frame to be spaced apart from each other, a first bracket disposed between the plurality of shielding materials and supported by an elastic mechanism, and a second bracket disposed outside an outermost shielding material among the plurality of shielding materials and supported by a cylinder.

A distance between the plurality of shielding materials may be formed to be less than ½ of a wavelength corresponding to an upper limited cutoff frequency.

The shielding material may include a cloth or a film.

A first foam gasket may be disposed between the shielding material and the first bracket, and between the shielding material and the window or door frame.

A second foam gasket may be disposed between the shielding material and the second bracket.

The multi-layered window or door system may further include an outer frame coupled to a side of the window or door frame to accommodate the shielding material therein, and the elastic mechanism and the cylinder may be secured to the outer frame.

The outer frame may include a first support and a second support, the elastic mechanism may be secured to the first support, and the cylinder may be secured to the second support.

When the second bracket is moved toward the window or door frame by the cylinder, the plurality of shielding materials and the first bracket may come into close contact with the window or door frame.

When the second bracket is moved away from the window or door frame by the cylinder, the first bracket may be restored to an original position thereof by the elastic mechanism.

In accordance with another aspect of the present disclosure to accomplish the above object, there is provided a multi-layered window or door system for EMP protection, including a frame-shaped window or door frame, a roll blinder formed on the window or door frame, a plurality of shielding materials coupled to a lower end of the roll blinder, a first bracket disposed between the plurality of shielding materials and supported by an elastic mechanism, and a second bracket disposed outside an outermost shielding material among the plurality of shielding materials and supported by a cylinder.

A distance between the plurality of shielding materials may be formed to be less than ½ of a wavelength corresponding to an upper limited cutoff frequency.

The shielding material may include a cloth or a film.

A first foam gasket may be disposed between the shielding material and the first bracket, and between the shielding material and the window or door frame.

A second foam gasket may be disposed between the shielding material and the second bracket.

The multi-layered window or door system may further include an outer frame coupled to a side of the window or door frame to accommodate the shielding material therein, and the elastic mechanism and the cylinder may be secured to the outer frame.

The outer frame may include a first support and a second support, the elastic mechanism may be secured to the first support, and the cylinder may be secured to the second support.

When the second bracket is moved toward the window or door frame by the cylinder, the plurality of shielding materials and the first bracket may come into close contact with the window or door frame.

When the second bracket is moved away from the window or door frame by the cylinder, the first bracket may be restored to an original position thereof by the elastic mechanism.

The shielding material may include a thin metal film, and shielding cloths, with a conductive adhesive applied to a surface of each of the shielding cloths, and surfaces of the shielding cloths to which the conductive adhesives are applied may be attached to both sides of the thin metal film.

A soft magnetic powder may be applied to a surface of the thin metal film.

Each of the shielding cloths may be made of a woven fabric and plated on both sides thereof.

The conductive adhesive may be produced by adding a metal powder additive to an acrylic adhesive.

A surface of each of the shielding cloths to which the conductive adhesives are applied may be attached to either side of the thin metal film in a rolling manner.

A first foam gasket may be disposed between the shielding material and the first bracket, and between the shielding material and the window or door frame, a second foam gasket may be disposed between the shielding material and the second bracket, and a portion of the shielding material contacting each of the first and second foam gaskets may be formed of only a thin metal film.

In accordance with another aspect of the present disclosure, there is provided a shielding material including a thin metal film, and shielding cloths, with a conductive adhesive applied to a surface of each of the shielding cloths, and surfaces of the shielding cloths to which the conductive adhesives are applied may be attached to both sides of the thin metal film.

A soft magnetic powder may be applied to a surface of the thin metal film.

Each of the shielding cloths may be made of a woven fabric and plated on both sides thereof.

The conductive adhesive may be produced by adding a metal powder additive to an acrylic adhesive.

A surface of each of the shielding cloths to which the conductive adhesives are applied may be attached to either side of the thin metal film in a rolling manner.

BRIEF DESCRIPTION OF THE DRAWINGS

The above and other objects, features and advantages of the present disclosure will be more clearly understood from the following detailed description taken in conjunction with the accompanying drawings, in which.

DESCRIPTION OF THE PREFERRED EMBODIMENTS

Figure 1:
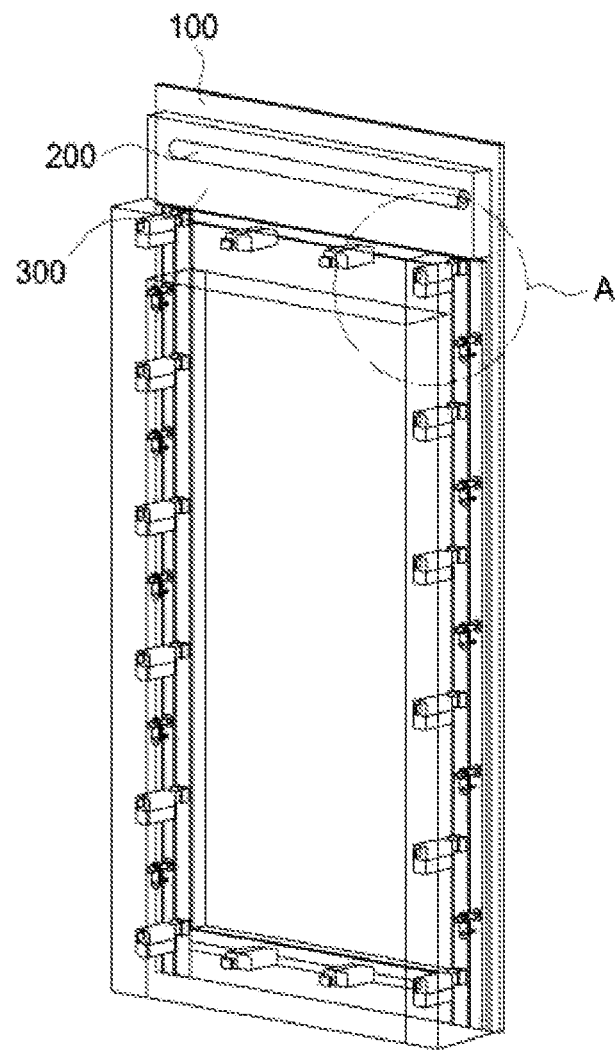
FIG. 1 is a schematic perspective view illustrating a double-layered window or door system for EMP prevention according to an embodiment.

Advantages and features of the present disclosure and methods for achieving the same will be clarified with reference to embodiments described later in detail together with the accompanying drawings. However, the present disclosure is capable of being implemented in various forms, and is not limited to the embodiments described later, and these embodiments are provided so that this disclosure will be thorough and complete and will fully convey the scope of the present disclosure to those skilled in the art. The present disclosure should be defined by the scope of the accompanying claims. The same reference numerals are used to designate the same components throughout the specification.

It will be understood that, although the terms "first" and "second" may be used herein to describe various components, these components are not limited by these terms. These terms are only used to distinguish one component from another component. Therefore, it will be apparent that a first component, which will be described below, may alternatively be a second component without departing from the technical spirit of the present disclosure.

The terms used in the present specification are merely used to describe embodiments, and are not intended to limit the present disclosure. In the present specification, a singular expression includes the plural sense unless a description to the contrary is specifically made in context. It should be understood that the term "comprises" or "comprising" used in the specification implies that a described component or step is not intended to exclude the possibility that one or more other components or steps will be present or added.

Unless differently defined, all terms used in the present specification can be construed as having the same meanings as terms generally understood by those skilled in the art to which the present disclosure pertains. Further, terms defined in generally used dictionaries are not to be interpreted as having ideal or excessively formal meanings unless they are definitely defined in the present specification.

In the present specification, each of phrases such as "A or B", "at least one of A and B", "at least one of A or B", "A, B, or C", "at least one of A, B, and C", and "at least one of A, B, or C" may include any one of the items enumerated together in the corresponding phrase, among the phrases, or all possible combinations thereof.

Embodiments of the present disclosure will now be described in detail with reference to the accompanying drawings. Like numerals refer to like elements throughout, and overlapping descriptions will be omitted.

Figure 2:
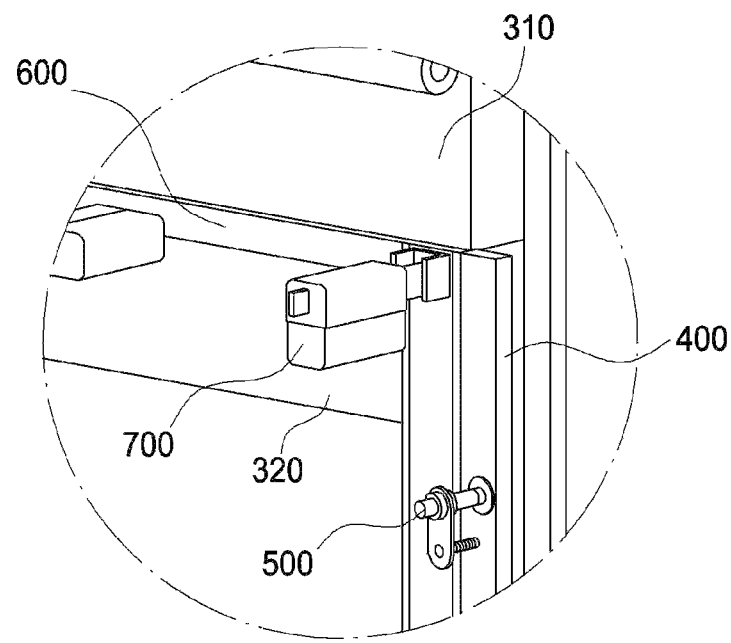
FIG. 2 is a diagram illustrating area A encircled in FIG. 1.
Figure 3:
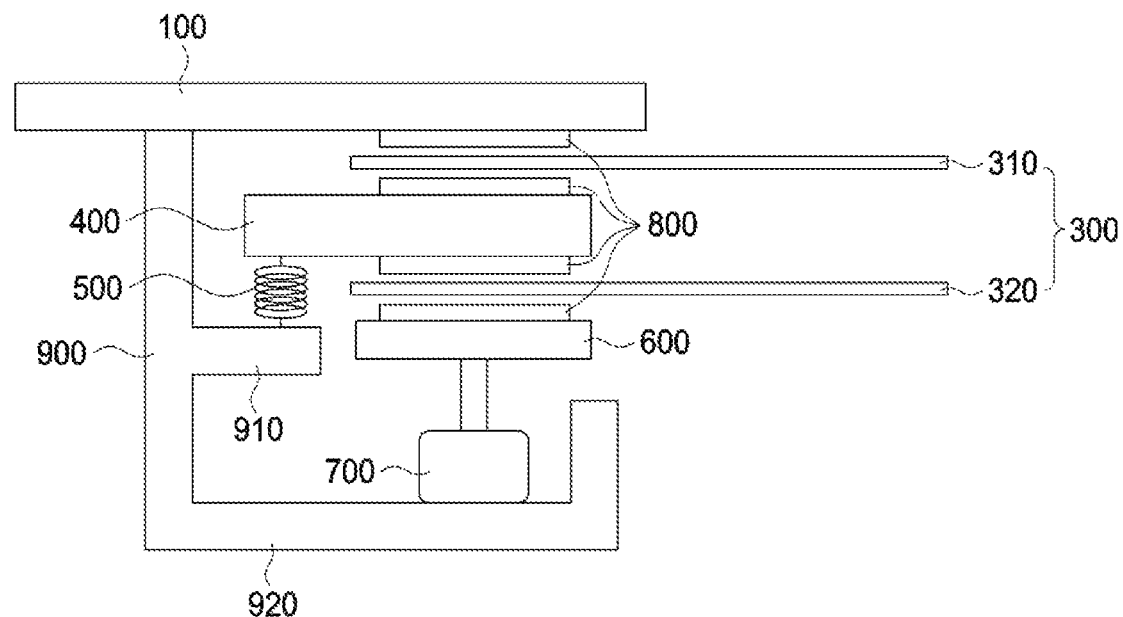
FIG. 3 is a sectional view illustrating the opening operation of the double-layered window or door system for EMP prevention according to an embodiment.
Figure 4:
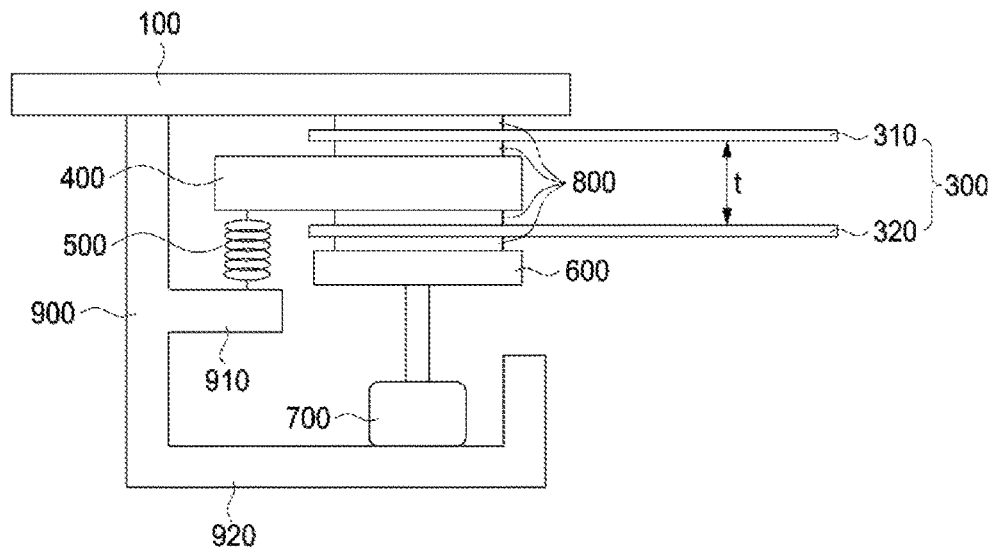
FIG. 4 is a sectional view illustrating the closing operation of the double-layered window or door system for EMP prevention according to an embodiment.

FIG. 1 is a schematic perspective view illustrating a double-layered window or door system for EMP prevention according to an embodiment, FIG. 2 is a diagram illustrating area A encircled in FIG. 1, FIG. 3 is a sectional view illustrating the opening operation of the double-layered window or door system for EMP prevention according to an embodiment, and FIG. 4 is a sectional view illustrating the closing operation of the double-layered window or door system for EMP prevention according to an embodiment.

Referring to FIG. 1, the double-layered window or door system for EMP prevention according to an embodiment may include a window or door frame 100 of a shielding facility, a double-layered shielding material 300 that is installed on the window or door frame 100, a first bracket 400 that supports the shielding material 300, and a second bracket 600 that opens or closes the double-layered shielding material 300.

The window or door frame 100 may refer to a frame in which a door or window of an EMP protection facility or a facility requiring EMP protection is installed. The window or door frame 100 may be formed in the shape of a polygonal frame that is open in a central portion thereof. The shape of the window or door frame 100 is not limited thereto.

A roll blinder 200 may be installed on an upper end of the window or door frame 100. The shielding material 300 may be installed in the roll blinder 200 in a rolled form. The roll blinder 200 may raise and lower the double-layered shielding material 300. The roll blinder 200 may raise and lower the shielding material 300 by winding or unwinding the shielding material 300. The lower end of the shielding material 300 may be treated to allow the shielding material 300 to be naturally lowered by its weight. The material of the shielding material 300 may include a shielding cloth or film. The material of the shielding material 300 will be described below in detail with reference to FIGS. 6 to 8.

As illustrated in FIGS. 2 and 3, the double-layered shielding material 300 may include a first shielding material 310 and a second shielding material 320. The first shielding material 310 and the second shielding material 320 may be installed on a side of the window or door frame 100 to be spaced apart from each other.

A distance t between the first shielding material 310 and the second shielding material 320 may be designed to be less than ½ of a wavelength corresponding to an upper limited cutoff frequency, thus ensuring high shielding performance. Due to the distance between the first shielding material 310 and the second shielding material 320, the shielding performance may be improved compared to the performance of the existing shielding structure. However, when the distance t between the first shielding material 310 and the second shielding material 320 is ½ of the cutoff frequency wavelength, the effect of improving the shielding performance due to the distance is eliminated by Equation (1), which is a transmission line reflection coefficient.

$$\frac{\Gamma(t)}{\Gamma(0)} = e^{-2j\beta t} \quad (1)$$

$\Gamma(0)$ represents the reflection coefficient of the shielding material itself, and) $\Gamma(l)$ represents a reflection coefficient at the distance t. When a phase constant $\beta$ is $2\pi/\lambda$ and t becomes $\lambda/2$ through Equation (1), a ratio of two reflection coefficients becomes one, so that the effect of improving the shielding performance due to the distance is eliminated. Therefore, in order to appropriately use the double-layered window or door system for EMP prevention, the distance may be designed to be less than ½ of the wavelength corresponding to the upper limited frequency of a desired frequency band.

The first bracket 400 may be disposed between the first shielding material 310 and the second shielding material 320, and be supported by an elastic mechanism 500. The first bracket 400 may be secured to an outer frame 900 that is coupled to a side of the window or door frame 100. The outer frame 900 may include a first support 910 and a second support 920, and an elastic mechanism 500 may be secured to the first support 910. In this regard, a spring may be used as the elastic mechanism 500, and the elastic mechanism is not limited to a particular type.

The second bracket 600 may be disposed outside the outermost shielding material in the double-layered shielding material. The second bracket 600 may be supported by a cylinder 700. The second bracket 600 may be secured to the second support 920 of the outer frame 900.

On the other hand, foam gaskets 800 may be installed between the shielding material 300 and the first bracket 400, between the first shielding material 310 and the window or door frame 100 and between the second shielding material 320 and the second bracket 600. The foam gasket 800 may improve the surface contact of the shielding material 300, thus reinforcing the shielding performance.

Hereinafter, the operation of the multi-layered window or door system for EMP protection will be described.

As illustrated in FIG. 3, when the shielding material 300 finishes lowering through the roll blinder 200 in the process of closing the open window or door system, the cylinder 700 is operated to push the second bracket 600. By the pushing force, the first bracket 400 also moves in the same direction. As illustrated in FIG. 4, the first bracket 400 and the second bracket 600 cause the shielding material 300 to come into close contact with a wall surface of the window or door frame 100.

When the cylinder 700 returns to its original state in the state of FIG. 4 in the process of opening the window or door system, as illustrated in FIG. 3, the second bracket 600 is secured to the cylinder 700 and then returns to its original position. The contact between the first bracket 400 and the second bracket 600 is completed, and the first bracket returns to its original position by the elastic mechanism 500.

Meanwhile, a reinforcing material such as an acrylic plate may be added to prevent damage to the shielding material due to external carelessness. In addition, when it is difficult to install an electric cylinder, a manual lever may be applied to secure or separate the bracket to or from the shielding material.

According to an embodiment, an elastic bracket is simply provided on a rack for EMP protection, thus remarkably improving the shielding performance.

Further, an embodiment can reduce a cost burden incurred when constructing the EMP prevention facility using an existing commercial window or door system for EMP prevention having high performance (80 dB or more).

Furthermore, an embodiment can maximize convenience by forming a shielding structure in the roll blind method of a general window.

Furthermore, an embodiment can minimize the use and processing of a galvanized steel sheet, thus reducing the weight of the window or door system for EMP prevention and increasing manufacturing efficiency.

According to an embodiment, the bracket may move back and forth to stably contact the window or door frame without impact compared to an existing swing- or sliding-type door, thus maximizing durability.

According to an embodiment, installation is easy, and it is possible to apply to a window or door system of an indoor office or a hospital in operation as low-cost and lightweight shielding measures.

Although it has been described above that the double-layered shielding material is formed, the shielding structure may be formed of a multi-layered shielding material without being limited thereto.

Figure 5:
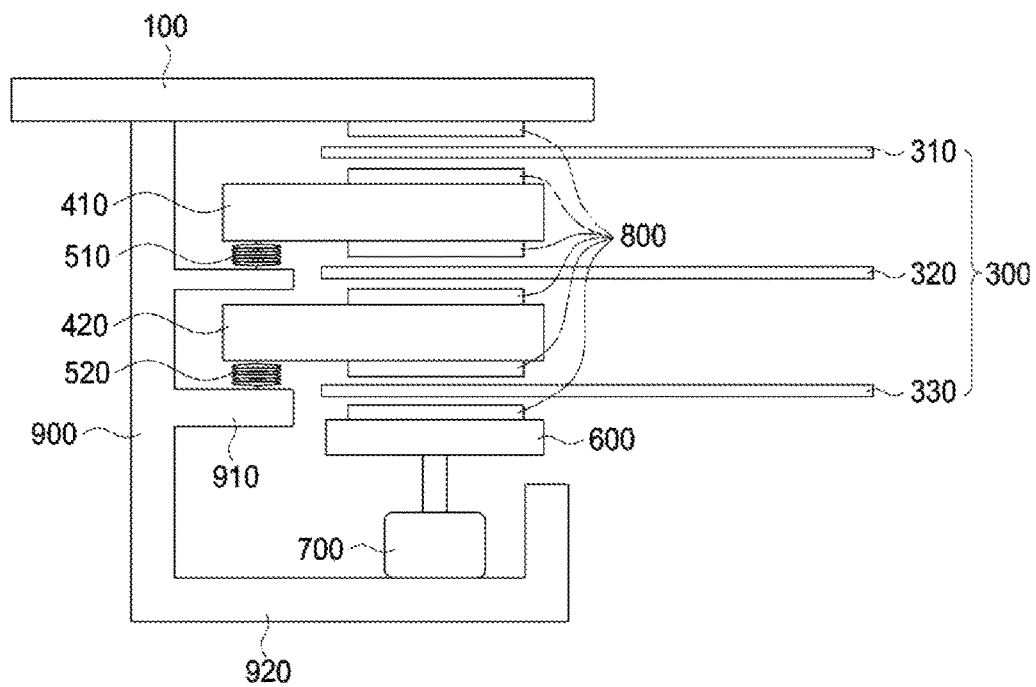
FIG. 5 is a sectional view illustrating a multi-layered window or door system for EMP prevention according to an embodiment.

FIG. 5 is a sectional view illustrating a multi-layered window or door system for EMP prevention according to an embodiment.

As illustrated in FIG. 5, the multi-layered window or door system for EMP protection may include a window or door frame 100 of a shielding facility, a multi-layered shielding material 300 that is installed on the window or door frame 100, a first bracket 400 that supports a first shielding material 310 and a second shielding material 320, and a second bracket 600 that opens or closes the multi-layered shielding material 300.

The window or door frame 100 may refer to a frame in which a door or window of an EMP protection facility or a facility requiring EMP protection is installed. The window or door frame 100 may be formed in the shape of a polygonal frame that is open in a central portion thereof. The shape of the window or door frame 100 is not limited thereto.

A roll blinder may be installed on an upper end of the window or door frame 100. The shielding material 300 may be installed on a lower end of the roll blinder. The roll blinder may raise and lower the multi-layered shielding material 300. The roll blinder may raise and lower the multi-layered shielding material 300 by winding or unwinding the multi-layered shielding material 300. The lower end of the shielding material 300 may be treated to allow the shielding material 300 to be naturally lowered by its weight. The material of the shielding material 300 may include a shielding cloth or film.

The multi-layered shielding material 300 may include a first shielding material 310, a second shielding material 320, and a third shielding material 330. The first shielding material 310, the second shielding material 320, and the third shielding material 330 may be installed on a side of the window or door frame 100 to be spaced apart from each other.

The first bracket 400 may include a 1-1 bracket 410 and a 1-2 bracket 420. The 1-1 bracket 410 may be disposed between the first shielding material 310 and the second shielding material 320, and be supported by a first elastic mechanism 510. In this regard, a spring may be used as the first elastic mechanism 510, and the elastic mechanism is not limited to a particular type.

The 1-2 bracket 420 may be disposed between the second shielding material 320 and the third shielding material 330, and be supported by a second elastic mechanism 520.

The second bracket 600 may be disposed outside the outermost shielding material in the multi-layered shielding material. The second bracket 600 may be supported by the cylinder 700. The second bracket 600 may be secured to the second support of the outer frame 900.

Meanwhile, foam gaskets 800 may be installed between the window or door frame 100, the shielding material 300, the first bracket 400, and the second bracket 600. The foam gasket 800 may improve the surface contact of the shielding material 300, thus reinforcing the shielding performance.

Figure 6:
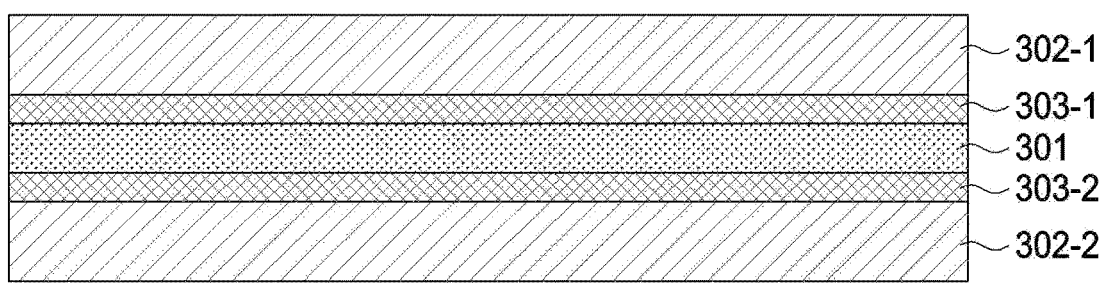
FIG. 6 is a sectional view of a shielding material of the double-layered window or door system for EMP prevention according to an embodiment.
Figure 7:
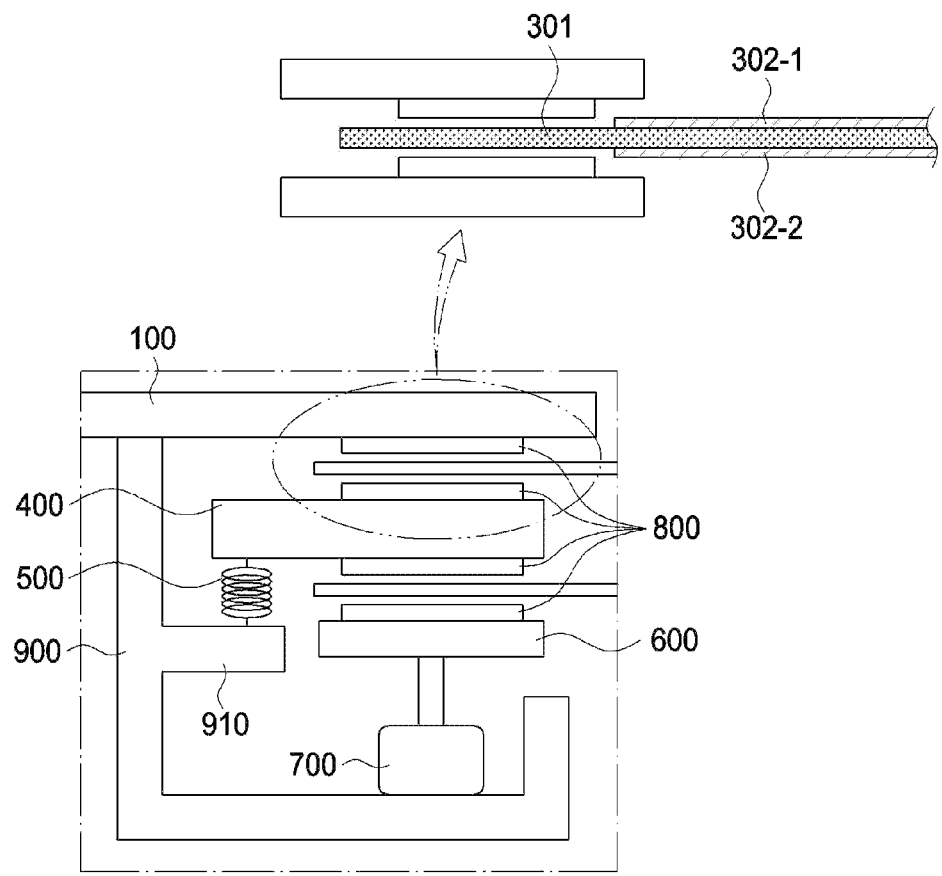
FIG. 7 is a sectional view of the shielding material in the open state of the double-layered window or door system for EMP prevention according to an embodiment.
Figure 8:
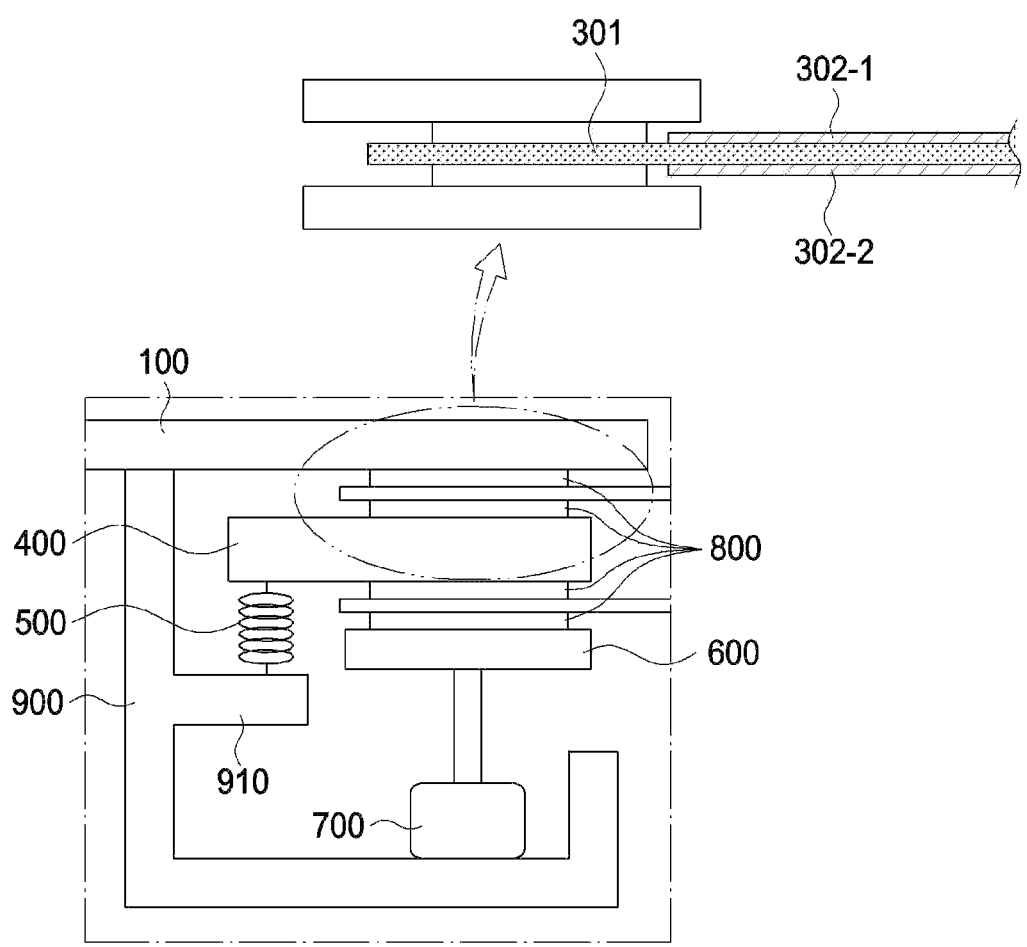
FIG. 8 is a sectional view of the shielding material in the closed state of the double-layered window or door system for EMP prevention according to an embodiment.

FIG. 6 is a sectional view of a shielding material of the double-layered window or door system for EMP prevention according to an embodiment, FIG. 7 is a sectional view of the shielding material in the open state of the double-layered window or door system for EMP prevention according to an embodiment, and FIG. 8 is a sectional view of the shielding material in the closed state of the double-layered window or door system for EMP prevention according to an embodiment.

Referring to FIG. 6, the shielding material 300 may include a thin metal film 301, and shielding cloths 302-1 and 302-2 whose surfaces are coated with conductive adhesives 303-1 and 303-2.

That is, the conductive adhesives 303-1 and 303-2 of the shielding cloths 302-1 and 302-2 may be attached to both sides of the thin metal film 301.

In this case, a soft magnetic powder may be applied to a surface of the thin metal film 301. That is, the soft magnetic powder may be applied to a surface of the thin metal film to improve conductivity as well as permeability, thus shielding electromagnetic waves over the entire band.

Such a thin metal film 301 may be made of copper, aluminum, or the like, and may have the thickness of 0.1 mm or less.

Each of the shielding cloths 302-1 and 302-2 may be made of a woven fabric and then be plated on both sides thereof. That is, the shielding cloth may be made of a material plated using copper/nickel metal.

Here, each of the shielding cloths 302-1 and 302-2 may be made of a material having the vertical thickness of up to 0.2 mm or less, in a state in which plating is completed so as to be implemented in a laminated form. By protecting both sides of the thin metal film 301 with the shielding cloths 302-1 and 302-2, durability and flexibility can be guaranteed.

Each of the conductive adhesives 303-1 and 303-2 may be produced by adding a metal powder additive to an acrylic adhesive.

In this case, the metal powder additive may contain nickel, copper, aluminum, silver, and conductive polymer. Thus, electrical conductive may be imparted.

The conductive adhesives 303-1 and 303-2 may electrically connect between the shielding cloth 302-1 and the thin metal film 301 and between the thin metal film 301 and the shielding cloth 302-2.

The surface of each of the shielding cloths 302-1 and 302-2 to which the conductive adhesives 303-1 and 303-2 are applied may be attached to either side of the thin metal film 301 in a rolling manner. In other words, when the shielding material 300 is manufactured through lamination, the conductive adhesive may be applied to a surface of each of the shielding cloths 302-1 and 302-2, and then the surface of each of the shielding cloths 302-1 and 302-2 to which the conductive adhesive is applied may be attached to either side of the thin metal film 301 in the rolling manner.

Here, each of the shielding cloths 302-1 and 302-2 may be manufactured such that a conductive adhesive surface thereof has the surface resistance of 0.07Ω/□ (or ohm/sq) or less and thereby a conductive adhesive layer has the thickness of 0.01 mm or less.

Meanwhile, when the shielding material 300 manufactured as described above is used for the double-layered window or door system for EMP prevention according to an embodiment, referring to FIGS. 7 and 8, a portion of the shielding material 300 contacting each of the foam gaskets 800 may be formed of only a thin metal film. This is to maximize the shielding performance of the laminate, and the longitudinal length of the shielding cloth should be considered when the laminate is manufactured. The aforementioned shielding material 300 may be equally applied to the multi-layered window or door system for EMP protection illustrated in FIG. 5.

The particular implementations illustrated and described herein are illustrative examples of the present disclosure and are not intended to limit the scope of the present disclosure in any way. For the sake of brevity, conventional electronics, control systems, software development, and other functional aspects of the systems may not be described in detail. Furthermore, the connecting lines or connectors illustrated in the various presented figures are intended to represent exemplary functional relationships and/or physical or logical couplings between the various elements. It should be noted that many alternative or additional functional relationships, physical connections, or logical connections may be present in an actual device. Moreover, no item or component may be essential to the practice of the present disclosure unless the element is specifically described as "essential" or "critical".

As described above, the present disclosure provides a multi-layered window or door system for EMP protection, which can improve shielding performance by using a double-layered shielding material.

Further, the present disclosure provides a multi-layered window or door system for EMP protection, which can minimize cost required to use an existing high-performance window or door system for EMP protection.

Furthermore, the present disclosure provides a multi-layered window or door system for EMP protection, which can maximize convenience by using a structure in which a shielding material is wound or unwound in a roll blinder manner.

Furthermore, the present disclosure provides a multi-layered window or door system for EMP protection, which can minimize the use and processing of a galvanized steel sheet, thus reducing weight and increasing manufacturing efficiency.

Furthermore, the present disclosure provides a multi-layered window or door system for EMP protection, which is configured to move a bracket back and forth as compared to a conventional swing- or sliding-type door, so that it can stably contact a window or door frame without impact, and thereby the durability of a device can be maximized.

Furthermore, the present disclosure provides a multi-layered window or door system for EMP protection, which is formed to have a simple structure, so that installation is easy, and it is possible to apply to a window or door system of an indoor office or a hospital in operation as low-cost and lightweight shielding measures.

Therefore, the spirit of the present disclosure should not be limited to the above-described embodiment, and all changes falling within meets and bounds of the claims, or equivalence of such meets and bounds are therefore intended to be embraced by the claims.

What is claimed is:

1. A multi-layered window or door system for an electromagnetic pulse (EMP) protection, comprising:
    a frame-shaped window or door frame;
    a plurality of shielding materials disposed on a side of the window or door frame to be spaced apart from each other;
    a first bracket disposed between the plurality of shielding materials, and supported by an elastic mechanism; and
    a second bracket disposed outside an outermost shielding material among the plurality of shielding materials, and supported by a cylinder.

2. The multi-layered window or door system of claim 1, wherein a distance between the plurality of shielding materials in a closed structure is formed to be less than ½ of a wavelength corresponding to an upper limited cutoff frequency.

3. The multi-layered window or door system of claim 1, wherein the shielding material comprises a cloth or a film.

4. The multi-layered window or door system of claim 1, wherein a first foam gasket is disposed between the shielding material and the first bracket and between the shielding material and the window or door frame.

5. The multi-layered window or door system of claim 4, wherein a second foam gasket is disposed between the shielding material and the second bracket.

6. The multi-layered window or door system of claim 1, further comprising:
    an outer frame coupled to a side of the window or door frame to accommodate the shielding material therein,
    wherein the elastic mechanism and the cylinder are secured to the outer frame.

7. The multi-layered window or door system of claim 6, wherein the outer frame comprises a first support and a second support, the elastic mechanism is secured to the first support, and the cylinder is secured to the second support.

8. The multi-layered window or door system of claim 1, wherein, when the second bracket is moved toward the window or door frame by the cylinder, the plurality of shielding materials and the first bracket come into close contact with the window or door frame.

9. The multi-layered window or door system of claim 8, wherein, when the second bracket is moved away from the window or door frame by the cylinder, the first bracket is restored to an original position thereof by the elastic mechanism.

10. The multi-layered window or door system of claim 1, wherein the shielding material comprises:
    a thin metal film; and
    shielding cloths, with a conductive adhesive applied to a surface of each of the shielding cloths,
    wherein surfaces of the shielding cloths to which the conductive adhesives are applied are attached to both sides of the thin metal film.

11. The multi-layered window or door system of claim 10, wherein a soft magnetic powder is applied to a surface of the thin metal film.

12. The multi-layered window or door system of claim 10, wherein each of the shielding cloths is made of a woven fabric and plated on both sides thereof.

13. The multi-layered window or door system of claim 10, wherein the conductive adhesive is produced by adding a metal powder additive to an acrylic adhesive.

14. The multi-layered window or door system of claim 10, wherein a surface of each of the shielding cloths to which the conductive adhesives are applied is attached to either side of the thin metal film in a rolling manner.

15. The multi-layered window or door system of claim 10, wherein:
- a first foam gasket is disposed between the shielding material and the first bracket, and between the shielding material and the window or door frame,
- a second foam gasket is disposed between the shielding material and the second bracket, and
- a portion of the shielding material contacting each of the first and second foam gaskets is formed of only a thin metal film.

\* \* \* \* \*